United States Patent
Stollwerck et al.

(10) Patent No.: US 12,130,308 B2
(45) Date of Patent: Oct. 29, 2024

(54) ADJUSTABLE VOLTAGE SENSOR

(71) Applicant: 3M INNOVATIVE PROPERTIES COMPANY, St. Paul, MN (US)

(72) Inventors: Guenther A. J. Stollwerck, Krefeld (DE); Mark Gravermann, Erkelenzq (DE); Bernd Schubert, Cologne (DE); Christine B. Bund, Wuppertal (DE); Mirco Gunjaca, Nottuln (DE); Jens Weichold, Erkelenz (DE); Johannes Fink, Bergheim (DE); Michael H. Stalder, Uedem (DE); Sebastian Eggert-Richter, Wülfrath (DE); Harald Westkamp, Hattingen (DE); Willy A. Ahlmann, Neuss (DE); Guenter M. Zilligen, Grevenbroich (DE)

(73) Assignee: 3M Innovative Properties Company, St. Paul, MN (US)

( * ) Notice: Subject to any disclaimer, the term of this patent is extended or adjusted under 35 U.S.C. 154(b) by 287 days.

(21) Appl. No.: 17/753,328

(22) PCT Filed: Sep. 14, 2020

(86) PCT No.: PCT/IB2020/058532
§ 371 (c)(1),
(2) Date: Feb. 28, 2022

(87) PCT Pub. No.: WO2021/059078
PCT Pub. Date: Apr. 1, 2021

(65) Prior Publication Data
US 2022/0317158 A1 Oct. 6, 2022

(30) Foreign Application Priority Data

Sep. 23, 2019 (EP) .................................... 19198862

(51) Int. Cl.
*G01R 15/16* (2006.01)
*G01R 15/04* (2006.01)
*G01R 19/00* (2006.01)

(52) U.S. Cl.
CPC ............. *G01R 15/16* (2013.01); *G01R 15/04* (2013.01); *G01R 19/0084* (2013.01)

(58) Field of Classification Search
CPC ..... G01R 15/04; G01R 15/16; G01R 19/0084
See application file for complete search history.

(56) References Cited

U.S. PATENT DOCUMENTS

| | | | |
|---|---|---|---|
| 6,351,884 | B1 | 3/2002 | Damaschke |
| 7,540,773 | B2 | 6/2009 | Ko |

(Continued)

FOREIGN PATENT DOCUMENTS

| | | |
|---|---|---|
| CN | 101581738 | 11/2009 |
| CN | 201477203 | 5/2010 |

(Continued)

OTHER PUBLICATIONS

International Search Report for PCT International Application No. PCT/IB2020/058532, mailed on Nov. 13, 2020, 5 pages.

*Primary Examiner* — Neel D Shah
*Assistant Examiner* — Adam S Clarke
(74) *Attorney, Agent, or Firm* — Gregg H. Rosenblatt

(57) ABSTRACT

Voltage sensor (1) comprising a voltage divider (40) for sensing an AC voltage of a HV/MV power conductor (10). For adjusting the common overall impedance of the low-voltage portion of the voltage divider towards a desired impedance, the low-voltage portion (60) comprises one or more low-voltage impedance elements (110), a plurality of adjustment impedance elements (80) and a plurality of switches. In its connect state, each switch electrically connects an adjustment impedance element in parallel to at least (Continued)

one of the one or more low-voltage impedance elements (110). The overall impedance of the high-voltage portion (50) and the overall impedance of the low-voltage portion (60) of the voltage divider (40) are adapted such that, by bringing one or more of the switches (90) into their connect state, the voltage divider (40) has, for an AC voltage of between 5 and 25 kV phase-to-ground and a frequency of between 40 and 70 Hertz, a dividing ratio of 3077, of 6154, of 6769 or of 10 000.

18 Claims, 5 Drawing Sheets

(56) References Cited

U.S. PATENT DOCUMENTS

| | | | |
|---|---|---|---|
| 7,815,901 | B2 | 10/2010 | Mathonneau |
| 2003/0184325 | A1 | 10/2003 | Koch |
| 2005/0122122 | A1 | 6/2005 | Yakymyshyn |
| 2016/0069937 | A1 | 3/2016 | Johnson |
| 2020/0159266 | A1 * | 5/2020 | Kerr .................. G05F 1/46 |

FOREIGN PATENT DOCUMENTS

| | | | |
|---|---|---|---|
| CN | 202351297 | | 7/2012 |
| CN | 205319701 U * | | 6/2016 |
| DE | 220704 | | 4/1985 |
| DE | 102005036512 | | 2/2006 |
| EP | 2605023 | | 6/2013 |
| EP | 2605416 | | 6/2013 |
| EP | 2993480 A1 * | 3/2016 | ............. G01R 15/06 |
| EP | 3499246 | | 6/2019 |
| RU | 2250471 | | 4/2005 |
| WO | WO 2018-234288 | | 12/2018 |

* cited by examiner

ADJUSTABLE VOLTAGE SENSOR

BACKGROUND

The present disclosure relates to alternating current (AC) voltage sensors for high or medium voltage power conductors in power networks and national grids, in particular to voltage sensors comprising a voltage divider. It also relates to methods of adjusting an impedance in such voltage dividers.

Power network operators utilize voltage sensors to determine the voltage of power conductors in their networks. With decentralized energy production, knowing the state of the network is indispensable for its proper operation and maintenance.

A common type of voltage sensors for AC voltages uses voltage dividers which have a high-voltage portion and a low-voltage portion which are serially connected between the high voltage of the power conductor and electrical ground. A contact between the high-voltage and the low-voltage portion provides a divided voltage which is proportional to the voltage of the power conductor and varies with it. The divided voltage (or "signal voltage") is measured and processed to determine the voltage of the power conductor. The proportionality factor between the voltage of the power conductor Vin and the signal voltage Vout is often referred to as the "dividing ratio" T, wherein Vout=Vin/T, and T depends on the ratio of the overall impedance of the high-voltage portion and the overall impedance of the low-voltage portion.

In order to evaluate the signal voltage independently from individual characteristics of the voltage divider, network operators often specify the dividing ratio precisely. However, the impedances of the components of the high-voltage portion and of the low-voltage portion are only specified to a certain accuracy, and their production tolerances are not negligible, so that the overall respective impedances of the high-voltage and low-voltage portions are predictable only within a certain corridor. Once assembled, the voltage divider may turn out to have a dividing ratio that is outside the accuracy specification of the network operator.

SUMMARY

The current disclosure relates to voltage sensors for use with MV or HV power distribution networks. In such networks, electrical power is distributed via HV/MV cables, transformers, switchgears, substations etc. with currents of hundreds of amperes and voltages of tens of kilovolts. The term "medium voltage" or "MV" as used herein refers to an AC voltage in the range of 1 kilovolt (kV) to 72 kV, whereas the term "high voltage" or "HV" refers to an AC voltage of more than 72 kV.

Traditionally, in high voltage (HV) and medium voltage (MV) power networks the dividing ratio of voltage dividers in AC voltage sensors was determined after assembly of the sensor and taken into account by adjusting downstream sensing circuitry (often referred to as an RTU) to the dividing ratio of the particular sensor before this sensing circuitry determined the voltage of the power conductor from the signal voltage output of the sensor. However, providing HV/MV voltage dividing sensors that have a given, consistent and predetermined dividing ratio may make the sensing circuitry simpler, because it does not need to cope with sensors having a—possibly wide—range of dividing ratios. Also, providing consistent sensors with predetermined dividing ratio facilitates exchange of one sensor for another sensor without having to adjust the sensing circuitry.

The present disclosure attempts to address these needs. In a first fundamental aspect it provides a voltage sensor for sensing an AC voltage of a HV/MV power conductor, the voltage sensor comprising a capacitive voltage divider for sensing the AC voltage, the voltage divider comprising a high-voltage portion comprising one or more high-voltage capacitors, electrically connected in series with each other;

a low-voltage portion comprising one or more low-voltage capacitors, electrically connected in series with each other between the high-voltage portion and electrical ground;

a signal contact, electrically arranged between the high-voltage portion and the low-voltage portion, for providing a signal voltage, indicative of the AC voltage, characterized in that the low-voltage portion further comprises, for adjusting the common overall impedance of the low-voltage portion towards a desired impedance, a plurality of adjustment capacitors and a plurality of switches, wherein each switch is associated and electrically connected to one or more of the adjustment capacitors and can be brought into a connect state and into a disconnect state such that the switch, in its connect state, electrically connects the adjustment capacitor(s), to which it is associated, in parallel to at least one of the one or more low-voltage capacitors; and in its disconnect state, electrically disconnects at least one electrode of the adjustment capacitor(s) to which it is associated from the low-voltage capacitor(s) to which, in its connect state, it connects the associated adjustment capacitor. The overall impedance of the high-voltage portion and the overall impedance of the low-voltage portion of the voltage divider are adapted such that, by bringing one or more of the switches into their connect state, the voltage divider has, for an AC voltage of between 5 and 25 kV phase-to-ground and a frequency of between 40 and 70 Hertz, a dividing ratio of 3077±0.5% or of 6154±0.5% or of 6769±0.5% or of 10 000±0.5%.

Each adjustment capacitors can be electrically connected in parallel, through its associated switch, to a low-voltage capacitor (or to a plurality of low-voltage capacitors). Adding the capacitance of the adjustment capacitor increases the capacitance of the low-voltage portion of the voltage divider and reduces its impedance, whereby the dividing ratio of the voltage divider becomes larger.

Providing a suitable number of adjustment capacitors of suitable respective impedances, each of which can be individually connected, by an associated switch, in parallel to one or more of the low-voltage capacitors, alone or in addition to other adjustment capacitors already connected in parallel, allows to reduce the overall accumulated impedance of the low-voltage portion and thereby allows to increase the dividing ratio T of the voltage divider to a desired, predetermined dividing ratio. The limits of this adjustment of the dividing ratio are given by the number of adjustment capacitors and their respective impedances, and by the accumulated impedance of the low-voltage capacitors.

Depending on the type(s) of switches used, an individual adjustment capacitor may be disconnected, by its associated switch, from the low-voltage capacitor(s) to which it was previously connected. An adjustment capacitor may be disconnected by disconnecting one electrode—or both electrodes—of the adjustment capacitor from the low-voltage capacitor(s) to which it was previously connected. This disconnection results in a higher overall accumulated impedance of the low-voltage portion and thereby in a smaller dividing ratio T of the voltage divider. Disconnection of one or more individual adjustment capacitors from the low-voltage portion can facilitate obtaining a desired, predetermined dividing ratio of the voltage divider.

The same principles can be applied in a resistive voltage divider. In a second fundamental aspect the present disclosure therefore also provides a voltage sensor for sensing an AC voltage of a HV/MV power conductor, the voltage sensor comprising a resistive voltage divider for sensing the AC voltage, the voltage divider comprising a high-voltage portion comprising one or more high-voltage resistors, electrically connected in series with each other;

a low-voltage portion comprising one or more low-voltage resistors, electrically connected in series with each other between the high-voltage portion and electrical ground;

a signal contact, electrically arranged between the high-voltage portion and the low-voltage portion, for providing a signal voltage, indicative of the AC voltage, characterized in that the low-voltage portion further comprises, for adjusting the common overall impedance of the low-voltage portion towards a desired impedance, a plurality of adjustment resistors and a plurality of switches, wherein each switch is associated and electrically connected to one or more of the adjustment resistors and can be brought into a connect state and into a disconnect state such that the switch in its connect state electrically connects the adjustment resistor(s), to which it is associated, in parallel to at least one of the one or more low-voltage resistors, and, in its disconnect state, electrically disconnects at least one contact of the adjustment resistor(s) to which it is associated from the low-voltage resistor(s) to which, in its connect state, it connects the associated adjustment resistor. The overall impedance of the high-voltage portion and the overall impedance of the low-voltage portion of the voltage divider are adapted such that, by bringing one or more of the switches into their connect state, the voltage divider has, for an AC voltage of between 5 and 25 kV phase-to-ground and a frequency of between 40 and 70 Hertz, a dividing ratio of 3077±0.5% or of 6154±0.5% or of 6769±0.5% or of 10 000±0.5%.

In an even more general sense, the present disclosure provides a voltage sensor for sensing an AC voltage of a HV/MV power conductor, the voltage sensor comprising a voltage divider for sensing the AC voltage, the voltage divider comprising a high-voltage portion comprising a plurality of discrete high-voltage impedance elements, electrically connected in series with each other;

a low-voltage portion comprising one or more discrete low-voltage impedance elements, electrically connected in series with each other between the high-voltage portion and electrical ground;

a signal contact, electrically arranged between the high-voltage portion and the low-voltage portion, for providing a signal voltage, indicative of the AC voltage, characterized in that the low-voltage portion further comprises, for adjusting the common overall impedance of the low-voltage portion towards a desired impedance, a plurality of adjustment impedance elements and a plurality of switches, wherein each switch is associated and electrically connected to one or more of the adjustment impedance elements and can be brought into a connect state and into a disconnect state such that the switch in its connect state, electrically connects the adjustment impedance element(s), to which it is associated, in parallel to at least one of the one or more low-voltage impedance elements, and, in its disconnect state, electrically disconnects at least one contact of the adjustment impedance element(s) to which it is associated from the low-voltage impedance element(s) to which, in its connect state, it connects the associated adjustment impedance element. The overall impedance of the high-voltage portion and the overall impedance of the low-voltage portion of the voltage divider are adapted such that, by bringing one or more of the switches into their connect state, the voltage divider has, for an AC voltage of between 5 and 25 kV phase-to-ground and a frequency of between 40 and 70 Hertz, a dividing ratio of 3077±0.5% or of 6154±0.5% or of 6769±0.5% or of 10 000±0.5%.

An adjustment capacitor is a regular capacitor that is electrically connected suitably with a switch associated to it such that it can be electrically connected in parallel to the low-voltage portion of the voltage divider, or to at least one of the low-voltage capacitors, by bringing the switch into its connect state. When the switch is in its disconnect state, the adjustment capacitor is not connected in parallel to the low-voltage portion of the voltage divider, or to at least one of the low-voltage capacitors.

An adjustment capacitor may be a discrete capacitor, a surface-mount capacitor, a through-hole capacitor or an embedded capacitor. Its electrodes may, for example, be formed by conductive traces or conductive areas in a support, e.g. on a circuit board or on a PCB (printed circuit board).

A discrete capacitor is a capacitor that exists without other elements having to be present to form the capacitor. In particular it may exist independent of a printed circuit board or conductive traces on a PCB or on other elements. A discrete resistor is a resistor that exists without other elements having to be present to form the resistor. In particular it may exist independent of a printed circuit board or conductive traces on a PCB or on other elements. Generally, a discrete impedance element (i.e. a discrete capacitor, a discrete resistor or a discrete inductor) is an impedance element that exists without other elements having to be present to form the impedance element. In particular it may exist independent of a printed circuit board or conductive traces on a PCB or on other elements.

An adjustment resistor is a regular resistor as described above that is electrically connected suitably with a switch associated to it such that it can be electrically connected in parallel to the low-voltage portion of the voltage divider, or to at least one of the low-voltage resistors, by bringing the switch into its connect state. When the switch is in its disconnect state, the adjustment resistor is not connected in parallel to the low-voltage portion of the voltage divider, or to at least one of the low-voltage resistors.

An adjustment resistor may be a discrete resistor, a surface-mount resistor, a through-hole resistor or an embedded resistor.

Generally, an adjustment impedance element is a regular impedance element (i.e. a resistor, a capacitor or an inductor) that is electrically connected suitably with a switch associated to it such that it can be electrically connected in parallel to the low-voltage portion of the voltage divider, or to at least one of the low-voltage impedance elements, by bringing the switch into its connect state. When the switch is in its disconnect state, the adjustment impedance element is not connected in parallel to the low-voltage portion of the voltage divider, or to at least one of the low-voltage impedance elements.

An adjustment impedance element may be a discrete impedance element, a surface-mount impedance element, a through-hole-mounted impedance element, or an embedded impedance element.

Switches that may be used for a voltage sensor according to this disclosure may, for example, be mechanically operated switches, in which a mechanic action brings the switch from its connect state into its disconnect state or vice versa, such as dip switches, or electrically operated switches, or optically operated switches. Switches in one voltage sensor according to the present disclosure may be of different types: A first switch and a third switch may, for example, be mechanical switches, a second switch may be an electrical switch, etc.

After being brought from its connect state into its disconnect state, or vice versa, a switch keeps its state (connect state or disconnect state) over at least a period of months or years, if left alone under normal operating conditions, i.e. under environmental conditions in switchgears or transformers of power networks for which these switchgears or transformers are specified by their manufacturers.

A switch may be an electrical element that can be brought from the disconnect state into the connect state, but thereafter cannot be brought back into its disconnect state. Alternatively, a switch may be an electrical element that can be brought from the connect state into the disconnect state, but thereafter cannot be brought back into its connect state. Preferably, however, a switch may be an electrical element that can be brought from the disconnect state into the connect state, and thereafter can be brought back into its disconnect state, and thereafter can be brought back into its connect state.

In embodiments in which one or more of the adjustment capacitors are supported on a PCB, a switch associated to one or more of the adjustment capacitors may be supported on the PCB. In embodiments in which one or more of the adjustment resistors are supported on a PCB, a switch associated to one or more of the adjustment resistors may be supported on the PCB.

A switch is considered associated to an adjustment capacitor or an adjustment resistor or an adjustment impedance element if the switch, by bringing it into its connect state, electrically connects this adjustment capacitor or adjustment resistor or adjustment impedance element in parallel to at least one of the one or more low-voltage capacitors or low-voltage resistors or low-voltage impedance elements of the voltage divider.

A low-voltage capacitor, as opposed to an adjustment capacitor, is part of the low-voltage portion from the outset, and before any switch is brought into its connect state. A low-voltage resistor, as opposed to an adjustment resistor, is part of the low-voltage portion from the outset, and before any switch is brought into its connect state.

The common overall impedance of the low-voltage portion of the voltage divider is the electrical impedance of the entire low-voltage portion including the contribution to the overall impedance of those adjustment capacitors or of those adjustment resistors which are electrically connected in parallel to any of the low-voltage capacitors or low-voltage resistors. The common overall impedance also includes contributions of any resistors or inductances that might be electrically connected to any of the low-voltage capacitors and contributions of any capacitors or inductances that might be electrically connected to any of the low-voltage resistors.

The dividing ratio T of the voltage divider is a dimensionless number that is obtained by dividing the sum of the overall impedances of the high-voltage portion and of the low-voltage portion by the value of the common overall impedance of the low-voltage portion by: $T=(Z_{LV}+Z_{HV})/Z_{LV}$. For a given temperature of the voltage divider and a given frequency of the AC voltage, the high-voltage portion of the voltage divider is assumed to have a fixed impedance $Z_{HV}$. In order to obtain a voltage divider that has a desired dividing ratio T*, the common overall impedance $Z_{LV}$ of the low-voltage portion is adjusted suitably to a desired impedance $Z_{LV}^*$ for $(Z_{LV}^*+Z_{HV})/Z_{LV}^*$ to be equal to the desired dividing ratio T*. This adjustment of $Z_{LV}$ is done by adding the impedances of selected ones of the adjustment capacitors or adjustment resistors to the impedance of the low-voltage portion, which in turn is done by bringing the respective associated switches of these selected adjustment capacitors/resistors into their connect states. The closing of these switches makes these adjustment capacitors/resistors part of the low-voltage portion.

In certain embodiments of a voltage sensor according to this disclosure, the plurality of adjustment capacitors comprises at least four adjustment capacitors, or wherein the plurality of adjustment capacitors comprises at least ten adjustment capacitors. In certain embodiments of a voltage sensor according to this disclosure, the plurality of adjustment resistors comprises at least four adjustment resistors, or wherein the plurality of adjustment resistors comprises at least ten adjustment resistors. A greater number of adjustment capacitors/resistors may allow for a finer adjustment of the common overall impedance of the low-voltage portion and thus a finer adjustment of the dividing ratio of the voltage divider.

In certain embodiments of a voltage sensor according to this disclosure, each adjustment capacitor is associated to one switch, and each switch is associated to one adjustment capacitor. In certain embodiments of a voltage sensor according to this disclosure, each adjustment resistor is associated to one switch, and each switch is associated to one adjustment resistor. A one-to-one assignment may facilitate greater control over the adjustment of the overall impedance of the low-voltage portion. It may also make the layout of the corresponding circuitry easier.

In certain embodiments of a voltage sensor according to this disclosure, two switches are associated to one adjustment capacitor, such that each of the two switches can connect the adjustment capacitor in parallel to at least one of the one or more low-voltage capacitors. In certain embodiments of a voltage sensor according to this disclosure, two switches are associated to one adjustment resistor, such that each of the two switches can connect the adjustment resistor in parallel to at least one of the one or more low-voltage resistors. This may provide redundancy in case of a failure of one switch. This, in turn, may enhance reliability of the voltage sensor.

In certain embodiments of a voltage sensor according to this disclosure, each adjustment capacitor has a capacitance of between 0.05% and 20.00% of the combined capacitance of the one or more low-voltage capacitors. In certain embodiments of a voltage sensor according to this disclosure, each adjustment resistor has a resistance of between 0.05% and 20.00% of the combined resistance of the one or more low-voltage resistors. Adjustment capacitors/resistors having electrical capacitances/resistances in this range may be particularly suitable to provide for a wide range of adjustment possibilities of the common overall impedance of the low-voltage portion of the voltage divider, both at coarser granularities and at fine granularities. This may enhance the versatility of the voltage sensor or may allow for use of cheaper, lower-accuracy-rated low-voltage capacitors/resistors or cheaper, lower-accuracy-rated high-voltage capacitors/resistors.

The term "impedance element" is used herein as to refer to capacitors and resistors and inductances collectively. Hence, more generally, in certain embodiments of a voltage sensor according to this disclosure, each adjustment impedance element has an electrical impedance of between 0.05% and 20.00% of the combined impedance of the one or more low-voltage impedances. Adjustment impedance elements having electrical impedances in this range may be particularly suitable to provide for a wide range of adjustment possibilities of the common overall impedance of the low-voltage portion of the voltage divider, both at coarser granularities and at fine granularities. This may enhance the versatility of the voltage sensor or may allow for use of cheaper, lower-accuracy-rated low-voltage impedance elements or cheaper, lower-accuracy-rated high-voltage impedance elements.

In certain embodiments of a voltage sensor according to this disclosure, each adjustment capacitor has a capacitance of between 0.2 nanofarad (nF) and 50 nF. Such adjustment capacitors may be particularly advantageous when adjusting the dividing ratio of a voltage divider in networks where the AC voltage has a common amplitude (e.g. 12 kV) and the signal voltage is supposed to be in a commonly required range, e.g. of between 1 and 10 Volt.

The so-called "E series" is a system of preferred values derived for use in electronic components. It consists of the E1, E3, E6, E12, E24, E48, E96 and E192 series, where the number after the 'E' designates the quantity of value "steps" in each series. Although it is theoretically possible to produce components of any value, in practice the need for inventory simplification has led the industry to settle on the E series for resistors, capacitors, and inductors. The E series of preferred numbers were chosen such that when a component is manufactured it will end up in a range of roughly equally spaced values on a logarithmic scale. Each E series subdivides the interval from 1 to 10 (decade) into steps of 3, 6, 12, 24, 48, 96, 192. An exemplary E6 series uses the values 1.0, 1.5, 2.2, 3.3, 4.7, and 6.8.

In certain embodiments of a voltage sensor according to this disclosure, the capacitances of the adjustment capacitors are equally spaced on a logarithmic scale. In certain of these embodiments, the capacitance values of the adjustment capacitors are equally spaced on a logarithmic scale, e.g. represented by an E6 series. In certain embodiments of a voltage sensor according to this disclosure, the resistance values of the adjustment resistors are equally spaced on a logarithmic scale. In certain of these embodiments, the resistances of the adjustment resistors are equally spaced on a logarithmic scale, e.g. represented by an E6 series.

In certain embodiments of a voltage sensor according to this disclosure, each adjustment capacitor has a capacitance which is different from the respective capacitances of all other adjustment capacitors. In certain embodiments of a voltage sensor according to this disclosure, each adjustment resistor has a resistance which is different from the respective resistances of all other adjustment resistors. This may allow for a finer granularity and accuracy in adjusting the overall impedance of the low-voltage portion and the dividing ratio of the voltage divider.

According to this disclosure, the overall impedance of the high-voltage portion and the overall impedance of the low-voltage portion of the voltage divider are adapted such that, by bringing one or more of the switches into their connect state, the voltage divider has, for an AC voltage of between 5 and 25 kV phase-to-ground and a frequency of between 40 and 70 Hertz, a dividing ratio of 3077±0.5% or of 6154±0.5% or of 6769±0.5% or of 10000±0.5%.

These dividing ratios help provide signal voltages that can be processed with existing, off-the-shelf equipment and thereby help to meet dominant market needs. Typically, an RTU (Remote Terminal Unit) processes the signal voltage of the voltage sensor according to the present disclosure, the signal voltage being the input voltage of the RTU. Many common RTUs are designed for processing an input voltage of 2.00 Volt at a nominal AC elevated voltage of 20 kV at a nominal AC frequency of 50 Hertz, or for an input voltage of 3.25 Volt at a nominal AC elevated voltage of 20 kV at a nominal AC frequency of 50 Hertz, or for specific input voltages of 6.50 Volt or of 2.95 Volt at a nominal AC elevated voltage of 20 kV at a nominal AC frequency of 50 Hertz. In order to be compatible with such common RTUs and hence to be more versatile, it is advantageous that the voltage divider of the sensor can be set to specific dividing ratios using the switches, namely at least to a dividing ratio of 3077 (for an RTU input voltage of 6.50 Volt at a nominal AC voltage of 20000 Volt and a nominal AC frequency of 50 Hertz), of 6154 (for an RTU input voltage of 3.25 Volt at a nominal AC voltage of 20000 Volt and a nominal AC frequency of 50 Hertz), of 6769 (for an RTU input voltage of 2.95 Volt at a nominal AC voltage of 20000 Volt and a nominal AC frequency of 50 Hertz) or of 10000 (for an RTU input voltage of 2.00 Volt at a nominal AC voltage of 20000 Volt and a nominal AC frequency of 50 Hertz). These specific dividing ratios are advantageous for any type of voltage divider comprised in the sensor, i.e. for a capacitive voltage divider as described herein, a resistive voltage divider as described herein, a mixed (capacitive-resistive) voltage divider, or other types of voltage dividers.

In certain of these embodiments the true dividing ratio T is within 0.5% of the desired dividing ratio T*, where this precision is obtained by selecting a suitable precision rating of the low-voltage capacitor(s) and a suitable set of adjustment capacitors and by connecting, using the switches, suitable ones of the adjustment capacitors in parallel to the low-voltage capacitor(s). In certain of these embodiments the true dividing ratio T is within 0.5% of the desired dividing ratio T*, where this precision is obtained by selecting a suitable precision rating of the low-voltage resistor(s) and a suitable set of adjustment resistors and by connecting, using the switches, suitable ones of the adjustment resistors in parallel to the low-voltage resistor(s).

For certain metering applications, particularly in Europe, it may be required that the signal voltage be approximately 100 Volt, where the AC voltage to be sensed is approximately 10 kV phase-to-ground at a frequency of 50 Hertz. This requirement translates into a desired dividing ratio T* of about 100.

The range of potentially desired dividing ratios is quite wide, namely from about 100 and below to about 10000 and above. Traditionally a manufacturer of voltage sensors would have covered this range by providing different types of voltage sensors, the types being of different hardware configurations and providing different dividing ratios in the range, and each type facilitating dividing ratio adjustment in a limited interval.

The present disclosure, however, provides for a voltage sensor that may cover the wide range of dividing ratios with a single hardware configuration, thus allowing manufacturers to reduce the number of stock items and gaining a cost advantage.

Hence in certain embodiments of the voltage sensor according to the present disclosure, the overall impedance of the high-voltage portion and the overall impedance of the low-voltage portion of the voltage divider are adapted such that the voltage divider, for an AC voltage of 10 kV phase-to-ground and a frequency of 50 Hertz, has a dividing ratio of 10±0.5% or less when one or more of the plurality switches are in their disconnect state, and has a dividing ratio of 10000±0.5% or more when at least one of these one or more of the plurality switches is in its connect state.

The voltage sensor as described herein may have an output impedance that varies with the dividing ratio and the related common overall impedance of the low-voltage portion determined by the specific combination of switches in connect state and switches disconnect state. Each output impedance is related to an allowed load impedance, i.e. the allowed sum of the impedances of all equipment connected to the signal contact, such as signal cables, connectors, voltage measurement devices like RTUs. As the voltage sensor is a passive voltage divider, the accuracy of the sensor's dividing ratio depends on the load impedance.

For reducing this dependency, the sensor may further comprise an impedance correction circuit. Such an impedance correction circuit may comprise, for example, an operational amplifier. For the signal voltage to remain "clean", and for not amplifying noise along with the signal voltage, the operational amplifier may be a non-inverting operational amplifier having an amplification factor of 1. The operational amplifier, suitably selected, provides a sensor output signal, e.g. to a remote terminal unit (RTU) processing the sensor output signal, which has a low output impedance. The impedance correction circuit is advantageously arranged close, e.g. within a few centimetres or very few decimetres, to the signal contact to keep the connecting wires between the signal contact and the circuit short and their impedance negligible. The low output impedance facilitates the use of longer wires or cables transmitting the sensor output signal from the impedance correction circuit to the remote terminal unit.

Hence generally, the voltage sensor according to the present disclosure may further comprise a non-inverting operational amplifier for providing a sensor output signal at a low output impedance, an input of the operational amplifier being electrically connected to the signal contact.

In certain embodiments of a voltage sensor according to this disclosure, at least one switch of the plurality of switches, after bringing it into its connect state, cannot be brought from its connect state into its disconnect state. An irreversible adjustment may, under specific circumstances, be instrumental in avoiding tampering, as well as sabotage, other intentional misadjustment or accidental misadjustment after installation.

In certain embodiments of a voltage sensor according to this disclosure, at least one of the switches is externally accessible. Where elements of the voltage sensor are encapsulated, e.g. in a solidified resin or in a rubber body or EPDM body, the encapsulating structure may comprise, for example, a window, a recess, or an opening to allow access to the at least one switch from outside the encapsulating structure. This may allow for an adjustment of the common overall impedance of the low-voltage portion (and hence of the dividing ratio of the voltage divider) after manufacturing, or during installation of the voltage sensor, or after the installation. For the same reason, in certain of these embodiments all of the switches are externally accessible.

In certain embodiments of a voltage sensor according to this disclosure, at least one of the switches is a dip switch. Dip switches are widely available at low cost and sufficiently reliable for many applications, and their use can thus contribute to a cost-effective manufacturing.

In certain embodiments of a voltage sensor according to this disclosure, at least one switch of the plurality of switches is adapted and/or arranged such that it can be brought into a connect state manually, or by a robotic actuator, or by pneumatic force. The possibility of manual adjustment provides for greater flexibility in how and when the switches can be actuated. Toolless operating of the switches is desirable under specific circumstances. On the other hand, robotic actuation or pneumatic actuation may help in automated manufacturing of the voltage sensor and may result in a more cost-effective manufacturing or calibration/adjustment process.

In certain embodiments of a voltage sensor according to this disclosure, the adjustment capacitors and the switches are arranged on a printed circuit board. In certain embodiments of a voltage sensor according to this disclosure, the adjustment resistors and the switches are arranged on a printed circuit board. Arrangement on a PCB may help provide a rugged support for the capacitors and switches. Also, PCBs are widely available and circuitry can be manufactured at low cost on PCBs, resulting in lower manufacturing cost of the voltage sensor.

In certain embodiments of a voltage sensor according to this disclosure, the printed circuit board has an elongated shape such that it can be accommodated in a cable. Accommodation in a cable can save space and may help provide environmental protection of the PCB and the electrical elements arranged on it.

In certain embodiments of a voltage sensor according to this disclosure, the printed circuit board has output pads, arranged and shaped to be soldered to pins of a connector, e.g. of an M12 connector. A direct mechanical and electrical connection of the PCB to a connector may make the use of an intermediate cable obsolete and may thereby help reduce the number of soldering points and increase the mechanical stability of the assembly of PCB and connector, thereby increasing reliability of the voltage sensor.

In certain embodiments of a voltage sensor according to this disclosure, the printed circuit board has a strain relief slot to engage with a strength member or a shield of a cable. An integrated strain relief feature takes mechanical load of the soldering points and thereby potentially increases their lifetime and reliability of the voltage sensor assembly.

The present invention also provides a power network for distributing electrical power in a national grid, the power network comprising an HV/MV power conductor and a voltage sensor as described herein, the voltage sensor being electrically connected to the power conductor to sense an AC voltage of the power conductor. Power networks incorporating a voltage sensor as described herein may be operated more efficiently due to accurate knowledge about the voltage in certain power conductors of the network.

The present invention also provides a method of adjusting the common overall impedance of the low-voltage portion of the voltage divider of a voltage sensor as described herein towards a desired impedance, the method comprising the step of bringing at least one of the switches into the connect state or into the disconnect state.

BRIEF DESCRIPTION OF THE DRAWINGS

The following Figure exemplifies particular embodiments of the invention.

DETAILED DESCRIPTION

Figure 1:
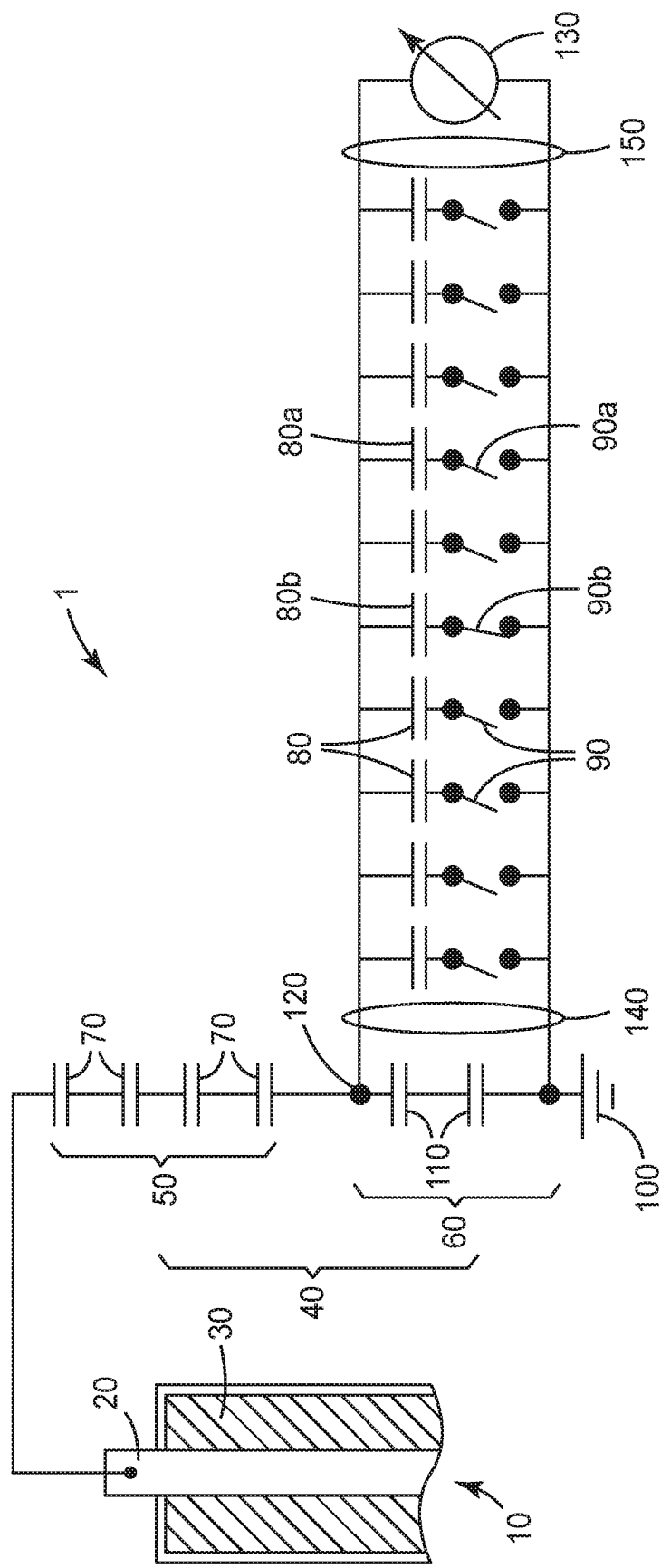
FIG. 1 Circuit diagram of a capacitive voltage sensor according to the present disclosure.

In the circuit diagram of FIG. 1, a capacitive voltage sensor 1 according to the present disclosure is illustrated. It is used for sensing an AC voltage of a high-voltage power cable 10, shown in a sectional view in FIG. 1. The cable 10 has a central conductor 20 surrounded by an insulation layer 30. In use, the central conductor 20 conducts electrical power in a national grid at an AC voltage of 12 kilovolt (kV) and at currents of hundreds of amperes.

The voltage sensor 1 is electrically connected to the central conductor 20 in order to sense the AC voltage of the conductor 20. For that sensing, the voltage sensor 1 comprises a voltage divider 40, which in turn consists of a high-voltage portion 50 and a low-voltage portion 60. The high-voltage portion 50 is electrically connected between the AC voltage of the central conductor 20 of the power cable 10 and the low-voltage portion 60, and it comprises four high-voltage capacitors 70, electrically connected in series with each other.

The low-voltage portion 60 is electrically connected between the high-voltage portion 50 and electrical ground 100, and it comprises two low-voltage capacitors 110, electrically connected between the high-voltage portion 50 and ground 100, and in series with each other.

A divided voltage or "signal voltage" can be picked up at a signal contact 120, located electrically between the high-voltage portion 50 and the low-voltage portion 60. The signal voltage is indicative of the AC voltage of the conductor 20, and varies proportionally with the AC voltage, the proportionality factor being the dividing ratio of the voltage divider 40. A voltage measurement device 130 is connected between the signal contact 120 and ground 100 to measure the signal voltage. A value of the AC voltage is obtained by multiplying the signal voltage with the dividing ratio.

The low-voltage portion 60 also comprises ten adjustment capacitors 80 and ten switches 90 in a particular configuration: Each adjustment capacitor 80 can be connected in parallel to the low-voltage capacitors 110 by closing a switch 90 associated to the adjustment capacitor 80.

In the embodiment shown in FIG. 1, each adjustment capacitor 80 has one switch 90 associated to it: the associated switch 90 of an adjustment capacitor 80 is the switch 90 which when closed (i.e. when brought into its "connect state") electrically connects the adjustment capacitor 80 in parallel to the low-voltage capacitors 110. For example, the one of the switches 90 which is associated to adjustment capacitor 80a is switch 90a, because when it is closed, it connects the adjustment capacitor 80a in parallel to the low-voltage capacitors 110. The switches 90 are dip switches that can be brought from their disconnect state into their connect state manually or by an automated tool, e.g. by a tool operated by a robot or by a pneumatic cylinder mechanism.

Except for switch 90b, the switches 90 are shown in their disconnect state, in which they disconnect one electrode the adjustment capacitors 80, to which they are associated respectively, from the low-voltage capacitors 110. Before closing the switch 90b, the impedance of the low-voltage portion 60 was the combined impedance of the low-voltage capacitors 110, which resulted in a certain dividing ratio of the voltage divider 40, taking into account the impedance of the high-voltage portion 50. After closing the switch 90b, the impedance of the adjustment capacitor 80b, now connected in parallel to the low-voltage capacitors 110, adds to the combined impedance of the low-voltage capacitors 110 according to the known laws of electricity, resulting in a smaller overall impedance of the low-voltage portion 60 and a larger dividing ratio T.

In order to facilitate meeting a specified dividing ratio, the adjustment capacitors 80 have different individual capacitances and hence different individual impedances. Starting from the combined impedance of the low-voltage capacitors 110, the addition of a small impedance may be sufficient to obtain the specified dividing ratio. A user may then select to connect a selected one of the ten adjustment capacitors 80 in parallel to the low-voltage capacitors 110, which adjustment capacitor 80 has the appropriate small additional impedance for the low-voltage portion 60 to have the appropriate overall impedance to provide the voltage divider 40 with the specified dividing ratio.

Evidently not only single adjustment capacitors 90 can be added, but two or three or four etc. or all switches 90 may be brought into their connect state to connect their associated adjustment capacitors 90 in parallel to the low-voltage capacitors 110.

In alternative embodiments the low-voltage portion 60 comprises twelve adjustment capacitors 80. Two of these adjustment capacitors 80 may have individual capacitances to bring the dividing ratio roughly close to a specific desired dividing ratio $T^*$, for example, $T^*=100$ or $T^*=3077$ or $T^*=6154$ or $T^*=6769$ or $T^*=10000$, but slightly below that specific desired dividing ratio. Two switches, each defining two states, provide four different switch combinations. In certain embodiments, each switch combination brings the dividing ratio roughly close to one of the four specific desired dividing ratios $T^*$.

The remaining ten adjustment capacitors 80 have individual capacitances which are chosen appropriately to match the desired dividing ratio with an accuracy of 1%, 0.5% or 0.2%. To minimize the number of parts, the values of the capacitances of these adjustment capacitors 80 are chosen such that their nominal capacitance values are equally spaced on a logarithmic scale, e.g. represented by an E6 series.

The voltage sensor 1 of FIG. 1 can be set to a given, desired dividing ratio at the time of manufacture by connecting its high-voltage portion to a well-known AC voltage of the intended operating frequency and the intended operating temperature, with all switches 90 in their disconnect states. Appropriate switches 90 (one switch or several switches) would then be brought into their connect states such that the signal voltage, as measured by the voltage measurement device 130, is at a voltage that is equal to the known AC voltage, multiplied by the desired dividing ratio.

The low-voltage capacitors 110, the adjustment capacitors 80 and the switches 90 can be arranged on a printed circuit board (PCB), which PCB may be located at a distance from the physical location of the high-voltage portion 60. Alternatively, only the adjustment capacitors 80 and the switches 90 can be arranged on a printed circuit board. The PCB could be located at a distance from the physical location of the low-voltage capacitors 110. A signal cable, indicated by 140, could lead signal wires from the signal contact 120 and the sensor ground 100 from the output of the low-voltage capacitors 110 to the PCB, and an output cable 150 could lead wires from the PCB output to the voltage measurement device 130.

In certain embodiments the adjustment capacitors 80 and the switches 90 are grouped physically next to each other and form a "calibration unit". This calibration unit may comprise a printed circuit board (PCB) on which the adjustment capacitors 80 and the switches 90 are arranged and supported.

Figure 2:
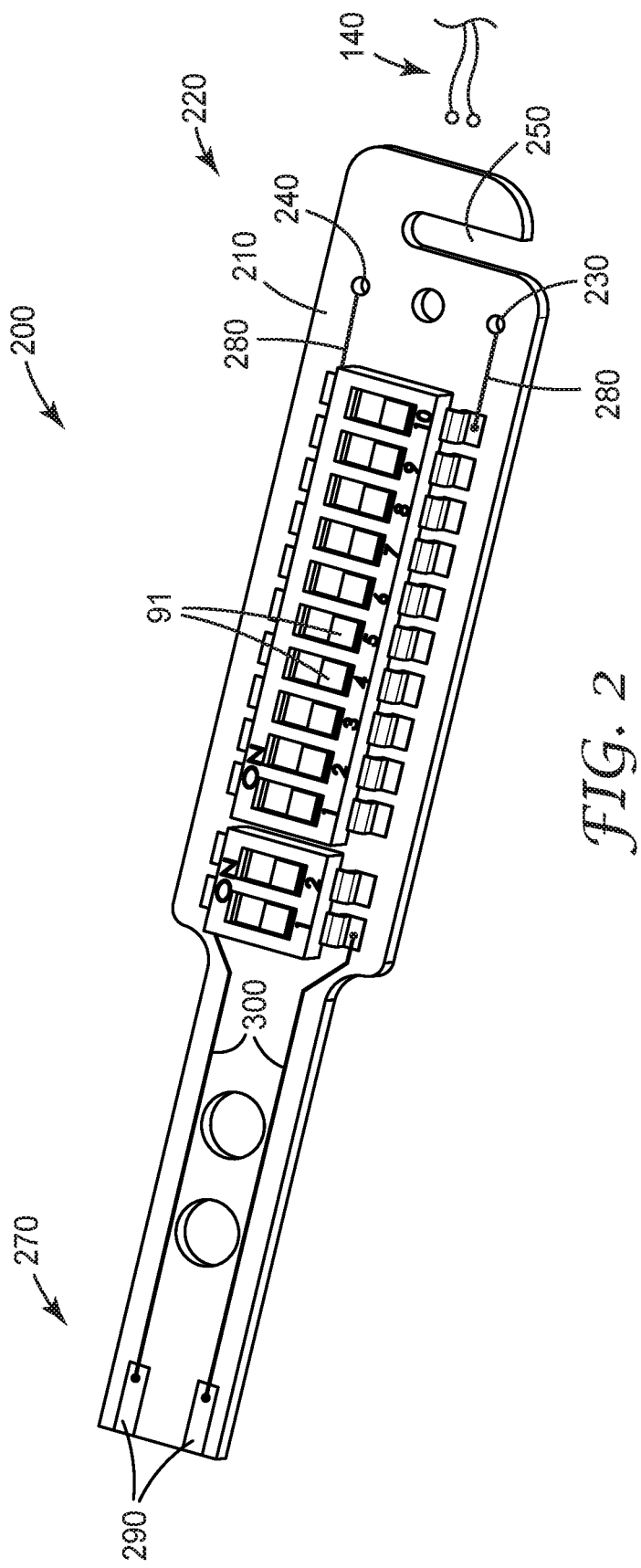
FIG. 2 Perspective view of a calibration unit for a sensor according to the present disclosure.

FIG. 2 illustrates, in a perspective view, a calibration unit 200 as described above. It comprises a PCB 210 of a generally elongated shape. Twelve dip switches 91 are arranged in a row, each switch 91 is associated to a corresponding adjustment capacitor, arranged underneath the switch 91 and hence not visible in FIG. 2. The adjustment capacitors and the switches 91 are electrically arranged as shown in FIG. 1, so that each switch 91 can be brought into a connect state, in which it connects its associated adjustment capacitor in parallel to one or more low-voltage capacitors 110.

The calibration unit 200 is shaped suitably to be accommodated in an output cable of the voltage sensor 1. A first end portion 220 of the PCB 210 has means to connect to a signal wire (carrying the signal voltage of the signal contact 120 of the voltage divider 40) and a ground wire in a signal cable 140. The signal wire can be soldered to a signal wire soldering point 230, and a ground wire can be soldered to a ground wire soldering point 240. From these soldering points 230, 240, conductive traces 280 on the PCB 210 lead to the adjustment capacitors 80 and the switches 90, as shown in FIG. 1.

A strain relief slot 250 and a strain relief opening 260 in the PCB 210 can receive and clamp an end portion of a shielding mesh (not shown) of the signal cable 140, thereby providing a strain relief for the signal cable 140.

At the opposed second end portion 270 of the PCB 210, a voltage measurement device 130 is to be connected to the set of adjustment capacitors 80 and the switches 90 on the PCB 210 via an output cable 150. For connecting the two wires (for ground and for the signal voltage) of the output cable 150, two contact pads 290 are placed at a distal edge of the PCB 210. The contact pads 290 are connected via conductive traces 300 to the set of adjustment capacitors 80 and the switches 90 on the PCB 210.

Figure 3:
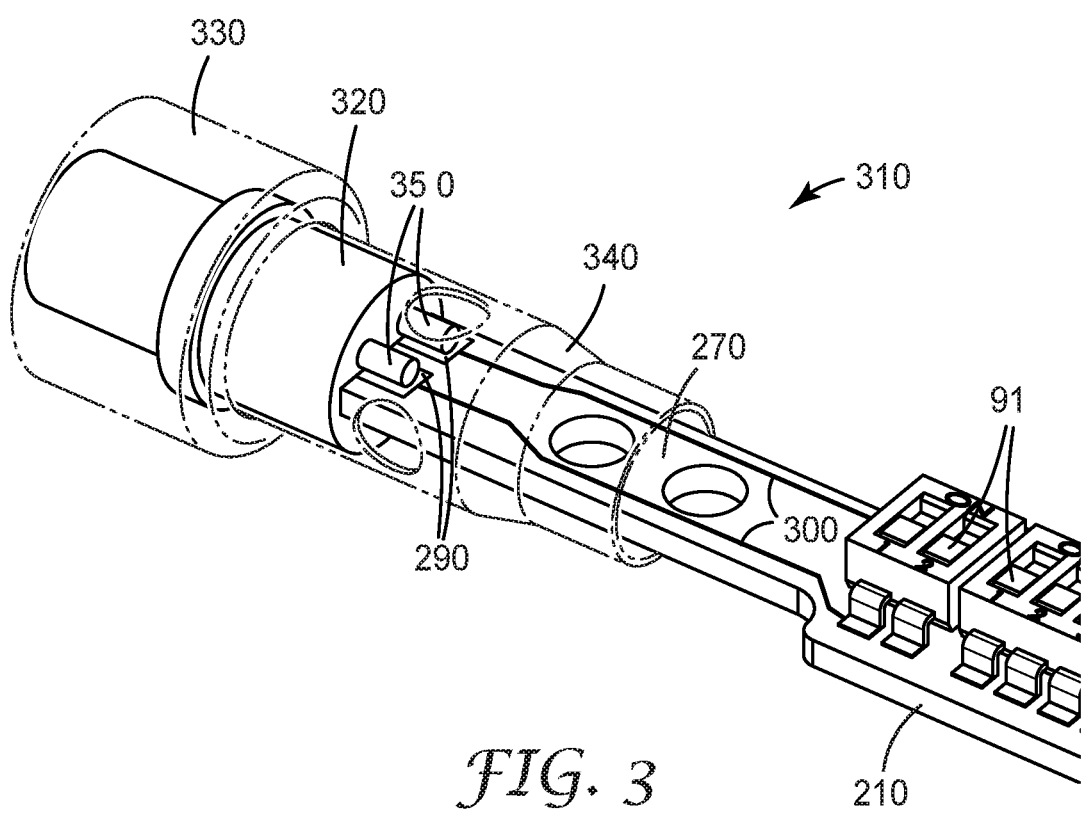
FIG. 3 Perspective view of a PCB of a voltage sensor according to the present disclosure, soldered to a connector.

It is often required that voltage sensors can be connected to measurement devices 130 and/or to processing units via so-called M12 connectors. As the perspective, semi-transparent view of FIG. 3 shows, an exemplary connector 310 comprises a central wiring piece 320 and a threaded cap nut 330, enveloping the wiring piece 320, and a connector sleeve 340 for covering the electrical connections of the wiring piece 320. To avoid a further wire leading from the PCB 210 to the central wiring piece 320 of a connector 310, the second end portion 270 of the PCB 210 is shaped suitably to allow sliding a cap nut 330 and a connector sleeve 340 over it. The second end portion 270 is therefore shaped to form a narrow protrusion, long enough to extend into an M12 connector 310 up to its wiring piece 320. The contact pads 290 on the PCB 210 are spaced suitably, so that they can be soldered directly to two corresponding contact pins 350 of the wiring piece 320. This direct connection of the adjustment capacitors 80 and their associated switches 91 to the connector 310 makes an output cable 150 between the PCB 210 and the connector 310 obsolete.

Figure 4:
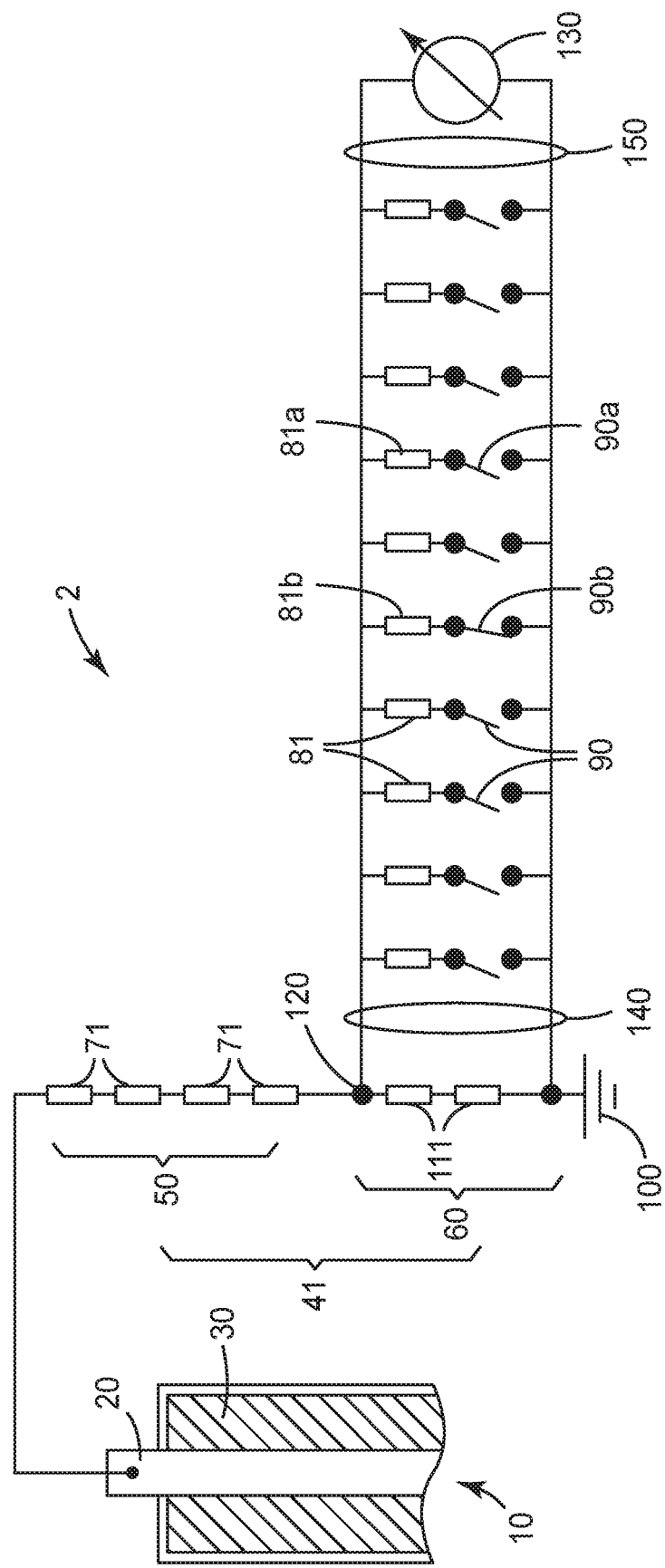
FIG. 4 Circuit diagram of a resistive voltage sensor according to the present disclosure.

In the circuit diagram of FIG. 4, a resistive voltage sensor 2 according to the present disclosure is illustrated. It is used for sensing an AC voltage of a high-voltage power cable 10, shown in a sectional view in FIG. 4. The cable 10 has a central conductor 20 surrounded by an insulation layer 30 as described above for FIG. 1.

The voltage sensor 2 is electrically connected to the central conductor 20 in order to sense the AC voltage of the conductor 20. For that sensing, the voltage sensor 2 comprises a resistive voltage divider 41, which in turn consists of a high-voltage portion 50 and a low-voltage portion 60. The high-voltage portion 50 is electrically connected between the AC voltage of the central conductor 20 of the power cable 10 and the low-voltage portion 60, and it comprises four high-voltage resistors 71, electrically connected in series with each other.

The low-voltage portion 60 is electrically connected between the high-voltage portion 50 and electrical ground 100, and it comprises two low-voltage resistors 111, electrically connected between the high-voltage portion 50 and ground 100, and in series with each other.

As described above for FIG. 1, a divided voltage or "signal voltage" can be picked up at a signal contact 120, located electrically between the high-voltage portion 50 and the low-voltage portion 60.

The low-voltage portion 60 also comprises ten adjustment resistors 81 and ten switches 90 in a particular configuration: Each adjustment resistor 81 can be connected in parallel to the low-voltage resistors 111 by closing a switch 90 associated to the adjustment resistor 81.

In the embodiment shown in FIG. 4, each adjustment resistor 81 has exactly one switch 90 associated to it: the associated switch 90 of an adjustment resistor 81 is the switch 90 which when closed (i.e. when brought into its "connect state") electrically connects the adjustment resistor 81 in parallel to the low-voltage resistors 111. For example, the one of the switches 90 which is associated to adjustment resistor 81*a* is switch 90*a*, because when it is closed, it connects the adjustment resistor 81*a* in parallel to the low-voltage resistors 111. The switches 90 are dip switches that can be brought from their disconnect state into their connect state manually or by an automated tool, e.g. by a tool operated by a robot or by a pneumatic cylinder mechanism.

Except for switch 90*b,* the switches 90 are shown in their disconnect state, in which they disconnect one contact of the adjustment resistors 81, to which they are associated respectively, from the low-voltage resistors 111. Before closing the switch 90*b,* the impedance of the low-voltage portion 60 was the combined impedance of the low-voltage resistors 111, which resulted in a certain dividing ratio of the voltage divider 41, taking into account the impedance of the high-voltage portion 50. After closing the switch 90*b,* the impedance of the adjustment resistor 80*b,* now connected in parallel to the low-voltage resistors 111, adds to the combined impedance of the low-voltage resistors 111 according to the known laws of electricity, resulting in a smaller overall impedance of the low-voltage portion 60 and a larger dividing ratio T.

In order to facilitate meeting a specified dividing ratio, the adjustment resistors 81 have different individual resistances and hence different individual impedances. Starting from the combined impedance of the low-voltage resistors 111, the addition of a small impedance may be sufficient to obtain the specified dividing ratio. A user may then select to connect a selected one of the ten adjustment resistors 81 in parallel to the low-voltage resistors 111, which adjustment resistor 81 has the appropriate small additional impedance for the low-voltage portion 60 to have the appropriate overall impedance to provide the voltage divider 40 with the specified dividing ratio.

Evidently not only single adjustment resistor 81 can be added, but two or three or four etc. or all switches 90 may be brought into their connect state to connect their associated adjustment resistors 81 in parallel to the low-voltage resistors 111.

The voltage sensor 2 of FIG. 4 can be set to a given, desired dividing ratio at the time of manufacture by connecting its high-voltage portion to a well-known AC voltage of the intended operating frequency and the intended operating temperature, with all switches 90 in their disconnect states. Appropriate switches 90 (one switch or several switches) would then be brought into their connect states such that the signal voltage, as measured by the voltage measurement device 130, is at a voltage that is equal to the known AC voltage, multiplied by the desired dividing ratio.

The low-voltage resistors 111, the adjustment resistors 81 and the switches 90 can be arranged on a printed circuit board (PCB), which PCB may be located at a distance from the physical location of the high-voltage portion 60. Alternatively, only the adjustment resistors 81 and the switches 90 can be arranged on a printed circuit board. The PCB could be located at a distance from the physical location of the low-voltage resistors 111. A signal cable, indicated by 140, could lead signal wires from the signal contact 120 and the sensor ground 100 from the output of the low-voltage resistors 111 to the PCB, and an output cable 150 could lead wires from the PCB output to the voltage measurement device 130.

In certain embodiments the adjustment resistors 81 and the switches 90 are grouped physically next to each other and form a "calibration unit". This calibration unit may comprise a printed circuit board (PCB) on which the adjustment resistors 81 and the switches 90 are arranged and supported.

Figure 5:
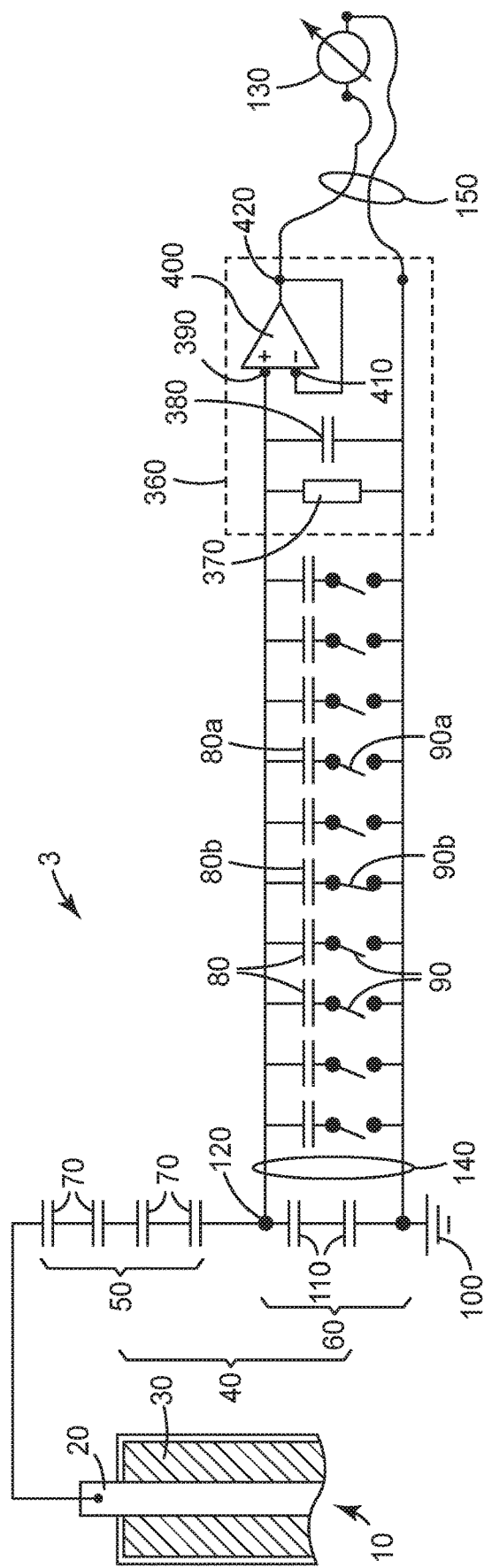
FIG. 5 Circuit diagram of a capacitive voltage sensor according to the present disclosure, including an impedance correction circuit.

FIG. 5 is a circuit diagram of a further capacitive voltage sensor 3 according to the present disclosure. It's identical to the voltage sensor of FIG. 1, except that it comprises an impedance correction circuit 360 for reducing the dependence of the sensing accuracy of the voltage sensor 3 from the load impedance. The impedance correction circuit 360 comprises a measurement resistor 370 and a measurement capacitor 380, electrically connected parallel to each other between the signal contact 120 and ground 100. The signal voltage is fed into the non-inverting input 390 of an operational amplifier 400, while the inverting input 410 is connected with the output 420 of the amplifier 400, resulting in an amplifier gain of 1. The unmodified signal voltage from the output 420 of the operational amplifier is transmitted to the voltage measurement device 130.

The operational amplifier 400 is a non-inverting operational amplifier having an amplification factor of 1, so that the signal voltage remains "clean", and noise is not amplified along with the signal voltage. The operational amplifier 400 is suitably selected to provide a sensor output signal to the voltage measurement device 130 processing the sensor output signal. The operational amplifier 400 has a low output impedance, so that the sensor output signal can be transmitted from the amplifier output 420 via longer wires to the voltage measurement device 130. The impedance correction circuit 360 is arranged close, e.g. within a few centimetres or very few decimetres, to the signal contact 120 to keep the connecting wires between the signal contact 120 and the circuit 360 short and their impedance negligible. The low output impedance of the amplifier 400 facilitates the use of longer output cables 150 transmitting the sensor output signal from the impedance correction circuit 360 to the voltage measurement device 130.

In the high-voltage portion 50 of the voltage sensor 3, the high-voltage capacitors 70 have a combined total impedance of 36 picofarad, while the low-voltage capacitors 110 have a combined total impedance of 3.4985 nanofarad (the measurement capacitor 380 has a capacitance of about 50 picofarad and makes no significant contribution to the overall impedance of the low-voltage portion 60). The dividing ratio of the voltage divider 40 is thus about 100. An AC input voltage at the power conductor 20 of 10 kilovolt results in a signal voltage of about 100 Volt at the voltage measurement device 130. Signal voltages in the 100 Volt range are in line with the requirements of certain power utility companies for metering applications in their power networks.

The invention claimed is:

1. Voltage sensor for sensing an alternating current (AC) voltage of a high-voltage/medium-voltage (HV/MV) power conductor, the voltage sensor comprising a capacitive voltage divider for sensing the AC voltage, the voltage divider comprising:

a high-voltage portion comprising one or more high-voltage capacitors, electrically connected in series with each other;

a low-voltage portion comprising one or more low-voltage capacitors, electrically connected in series with each other between the high-voltage portion and electrical ground;

a signal contact, electrically arranged between the high-voltage portion and the low-voltage portion, for providing a signal voltage, indicative of the AC voltage, wherein the low-voltage portion further comprises, for adjusting the common overall impedance of the low-voltage portion towards a desired impedance, a plurality of adjustment capacitors and a plurality of switches, wherein each switch is associated and electrically connected to one or more of the adjustment capacitors and can be brought into a connect state and into a disconnect state such that the switch in its connect state, electrically connects the adjustment capacitor(s), to which it is associated, in parallel to at least one of the one or more low-voltage capacitors;

in its disconnect state, electrically disconnects at least one electrode of the adjustment capacitor(s) to which it is associated from the low-voltage capacitor(s) to which, in its connect state, it connects the associated adjustment capacitor, and wherein the overall impedance of the high-voltage portion and the overall impedance of the low-voltage portion of the voltage divider are adapted such that, by bringing one or more of the switches into their connect state, the voltage divider has, for an AC voltage of between 5 and 25 kilovolt (kV) phase-to-ground and a frequency of between 40 and 70 Hertz, a dividing ratio of 3077±0.5% or of 6154±0.5% or of 6769±0.5% or of 10 000±0.5%.

2. Voltage sensor according to claim 1, wherein the plurality of adjustment capacitors comprises at least four adjustment capacitors, or wherein the plurality of adjustment capacitors comprises at least ten adjustment capacitors.

3. Voltage sensor according to claim 1, wherein each adjustment capacitor is associated to one switch, and wherein each switch is associated to one adjustment capacitor.

4. Voltage sensor according to claim 1, wherein two switches are associated to one adjustment capacitor, such that each of the two switches can connect the adjustment capacitor in parallel to at least one of the one or more low-voltage capacitors.

5. Voltage sensor according to claim 1, wherein each adjustment capacitor has a capacitance of between 0.05% and 20.00% of the combined capacitance of the one or more low-voltage capacitors.

6. Voltage sensor according to claim 1, wherein the nominal capacitance values of the adjustment capacitors are equally spaced on a logarithmic scale.

7. Voltage sensor according to claim 1, wherein the overall impedance of the high-voltage portion and the overall impedance of the low-voltage portion of the voltage divider are adapted such that the voltage divider, for an AC voltage of 10 kV phase-to-ground and a frequency of 50 Hertz, has a dividing ratio of 10±0.5% or less when one or more of the plurality switches are in their disconnect state, and has a dividing ratio of 10 000±0.5% or more when at least one of these one or more of the plurality switches is in its connect state.

8. Voltage sensor according to claim 1, further comprising a non-inverting operational amplifier for providing a sensor output signal at a low output impedance, an input of the operational amplifier being electrically connected to the signal contact.

9. Voltage sensor according to claim 1, wherein at least one switch of the plurality of switches, after bringing it into its connect state, cannot be brought from its connect state into its disconnect state.

10. Voltage sensor according to claim 1, wherein at least one of the switches is externally accessible.

11. Voltage sensor according to claim 1, wherein at least one switch of the plurality of switches is adapted and/or arranged such that it can be brought into a connect state manually, or by a robotic actuator, or by pneumatic force.

12. Voltage sensor according claim 1, wherein the adjustment capacitors and the switches are arranged on a printed circuit board.

13. Voltage sensor according to claim 12, wherein the printed circuit board has an elongated shape such that it can be accommodated in a cable.

14. Voltage sensor according to claim 12, wherein the printed circuit board has output pads, arranged and shaped to be soldered to pins of a connector (310).

15. Voltage sensor according to claim 12, wherein the printed circuit board has a strain relief slot to engage with a strength member or a shield of a cable.

16. Power network for distributing electrical power in a national grid, the power network comprising an HV/MV power conductor and a voltage sensor according to claim 1, the voltage sensor being electrically connected to the power conductor to sense an AC voltage of the power conductor.

17. Method of adjusting the common overall impedance of the low-voltage portion of the voltage divider of a voltage sensor according to claim 1 towards a desired impedance, the method comprising the step of bringing at least one of the switches into the connect state or into the disconnect state.

18. Voltage sensor for sensing an AC voltage of a HV/MV power conductor, the voltage sensor comprising a resistive voltage divider for sensing the AC voltage, the voltage divider comprising
- a high-voltage portion comprising one or more high-voltage resistors, electrically connected in series with each other;
- a low-voltage portion comprising one or more low-voltage resistors, electrically connected in series with each other between the high-voltage portion and electrical ground;
- a signal contact, electrically arranged between the high-voltage portion and the low-voltage portion, for providing a signal voltage, indicative of the AC voltage,
- wherein the low-voltage portion further comprises, for adjusting the common overall impedance of the low-voltage portion towards a desired impedance, a plurality of adjustment resistors and a plurality of switches, wherein each switch is associated and electrically connected to one or more of the adjustment resistors and can be brought into a connect state and into a disconnect state such that the switch
- in its connect state, electrically connects the adjustment resistor(s), to which it is associated, in parallel to at least one of the one or more low-voltage resistors;
- in its disconnect state, electrically disconnects at least one contact of the adjustment resistor(s) to which it is associated from the low-voltage resistor(s) to which, in its connect state, it connects the associated adjustment resistor,
- wherein the overall impedance of the high-voltage portion and the overall impedance of the low-voltage portion of the voltage divider are adapted such that, by bringing one or more of the switches into their connect state, the voltage divider has, for an AC voltage of between 5 and 25 kV phase-to-ground and a frequency of between 40 and 70 Hertz, a dividing ratio of 3077±0.5% or of 6154±0.5% or of 6769±0.5% or of 10 000±0.5%.

* * * * *